US010880193B2

(12) United States Patent
Yoshida et al.

(10) Patent No.: US 10,880,193 B2
(45) Date of Patent: Dec. 29, 2020

(54) ERROR CORRECTION DEVICE, ERROR CORRECTION METHOD, AND COMMUNICATION DEVICE

(71) Applicants: NTT Electronics Corporation, Yokohama (JP); NIPPON TELEGRAPH AND TELEPHONE CORPORATION, Tokyo (JP)

(72) Inventors: Mitsuteru Yoshida, Kanagawa (JP); Yasuyuki Endo, Kanagawa (JP); Etsushi Yamazaki, Kanagawa (JP); Katsuichi Oyama, Kanagawa (JP); Yasuharu Onuma, Kanagawa (JP); Masahito Tomizawa, Kanagawa (JP)

(73) Assignees: NTT ELECTRONICS CORPORATION, Yokohama (JP); NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 16/471,258

(22) PCT Filed: Dec. 15, 2017

(86) PCT No.: PCT/JP2017/045125
§ 371 (c)(1),
(2) Date: Jun. 19, 2019

(87) PCT Pub. No.: WO2018/154934
PCT Pub. Date: Aug. 30, 2018

(65) Prior Publication Data
US 2020/0028767 A1  Jan. 23, 2020

(30) Foreign Application Priority Data
Feb. 22, 2017 (JP) ................... 2017-030818

(51) Int. Cl.
*H04L 12/26* (2006.01)
*H03M 13/29* (2006.01)
(Continued)

(52) U.S. Cl.
CPC .... *H04L 43/0847* (2013.01); *H03M 13/2912* (2013.01); *H04L 5/0008* (2013.01); *H04L 5/026* (2013.01); *H04N 21/2383* (2013.01)

(58) Field of Classification Search
CPC ..... H04L 43/0847; H04L 43/00; H04L 43/50; H04L 5/0008; H04L 5/026; H04L 5/0007;
(Continued)

(56) References Cited

U.S. PATENT DOCUMENTS 6,182,264 B1 *  1/2001  Ott ................. H03M 13/09
714/774
7,903,629 B2 *  3/2011  Walker ............ H04B 7/18523
370/344
(Continued)

OTHER PUBLICATIONS

Suzuki et al, Summary Report "R&D on the Digital Coherent Signal Processing Technology for Large-capacity Optical Communication Networks", The Journal of the Institute of Electronics, Information and Communication Engineers, vol. 95, No. 12, pp. 1100-1116, 2012, with partial English translation.
(Continued)

*Primary Examiner* — Sharad Rampuria
(74) *Attorney, Agent, or Firm* — Myers Wolin, LLC.

(57) ABSTRACT

A plurality of error correction circuits corrects errors of the data transmitted through the plurality of transmission lines. A combining portion combines the plurality of transmission lines to the plurality of error correction circuits. The plurality of transmission lines includes a first transmission line, and a second transmission line having a lower transmission characteristic than the first transmission line. The plurality of error correction circuits includes a first and a second error
(Continued)

correction circuit having lower error correction capability and power consumption than the first error correction circuit. The combining portion uses a function to combine a plurality of error correction circuits with one transmission path, combines the first transmission line with the second error correction circuit at a higher rate than the first error correction circuit, and combines the second transmission line with the first error correction circuit at a higher rate than the second error correction circuit.

8 Claims, 14 Drawing Sheets

(51) Int. Cl.
    *H04L 5/00*           (2006.01)
    *H04L 5/02*           (2006.01)
    *H04N 21/2383*    (2011.01)

(58) Field of Classification Search
    CPC ..... H04L 1/0042; H04L 1/0045; H04L 1/007; H04L 27/34; H04L 27/18; H04L 27/26; H03M 13/2912; H03M 483/46; H03M 13/1102; H03M 13/1515; H03M 13/6502; H03M 13/3761; H03M 13/25; H03M 13/35; H04N 21/2383; H04B 10/00; H04B 17/00; H04B 3/46; H04W 24/00
    See application file for complete search history.

(56) References Cited

U.S. PATENT DOCUMENTS

| | | | |
|---|---|---|---|
| 8,484,539 B1* | 7/2013 | Yeung | G06F 11/3041 |
| | | | 714/774 |
| 9,954,555 B2* | 4/2018 | Voutilainen | H04L 1/0072 |
| 2009/0213961 A1* | 8/2009 | Park | H04L 1/0003 |
| | | | 375/297 |

OTHER PUBLICATIONS

International Search Report issued by the Japan Patent Office for corresponding International Patent Application No. PCT/JP2017/045125, dated Feb. 13, 2018.

English translation of Notification of Transmittal of Translation of the International Preliminary Report on Patentability and Written Opinion of the International Searching Authority for International Patent Application No. PCT/JP2017/045125 dated Sep. 6, 2019.

* cited by examiner

FIG. 6

|  | EXAMPLE 1 | EXAMPLE 2 | EXAMPLE 3 | EXAMPLE 4 |
|---|---|---|---|---|
|  | MULTI-LEVELED BITS ARE USED | HYBRID MODULATION | | |
| TRANSMISSION LINE I | HIGH-ORDER BIT@16QAM MULTI-LEVEL | QPSK@ OFDM SUBCARRIER | QPSK@ TIME DIVISION | QPSK@ X POLARIZED WAVE |
| TRANSMISSION LINE II | LOW-ORDER BIT@16QAM MULTI-LEVEL | 16QAM@ OFDM SUBCARRIER | 16QAM@ TIME DIVISION | 16QAM@ Y POLARIZED WAVE |

FIG. 7
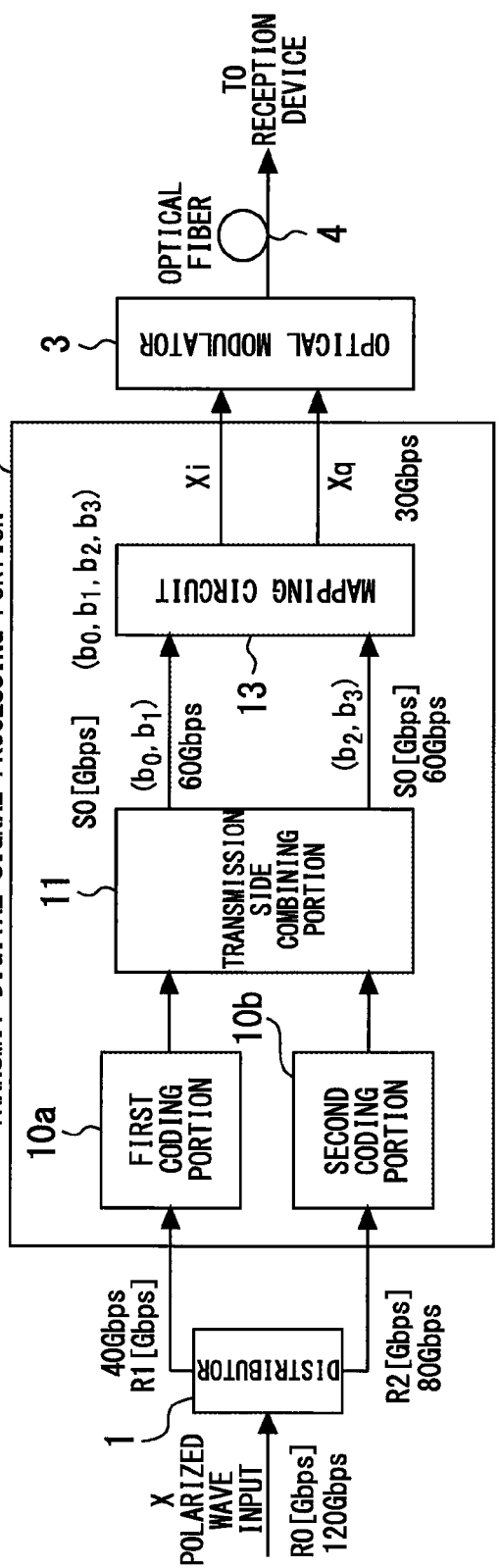
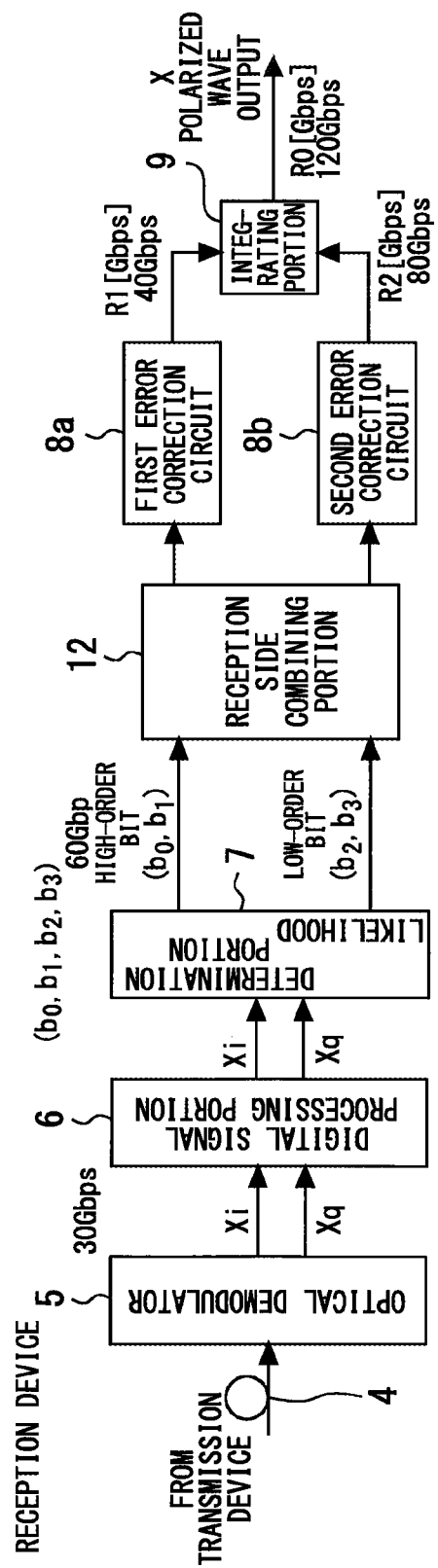

HIGH-ORDER BIT

LOW-ORDER BIT

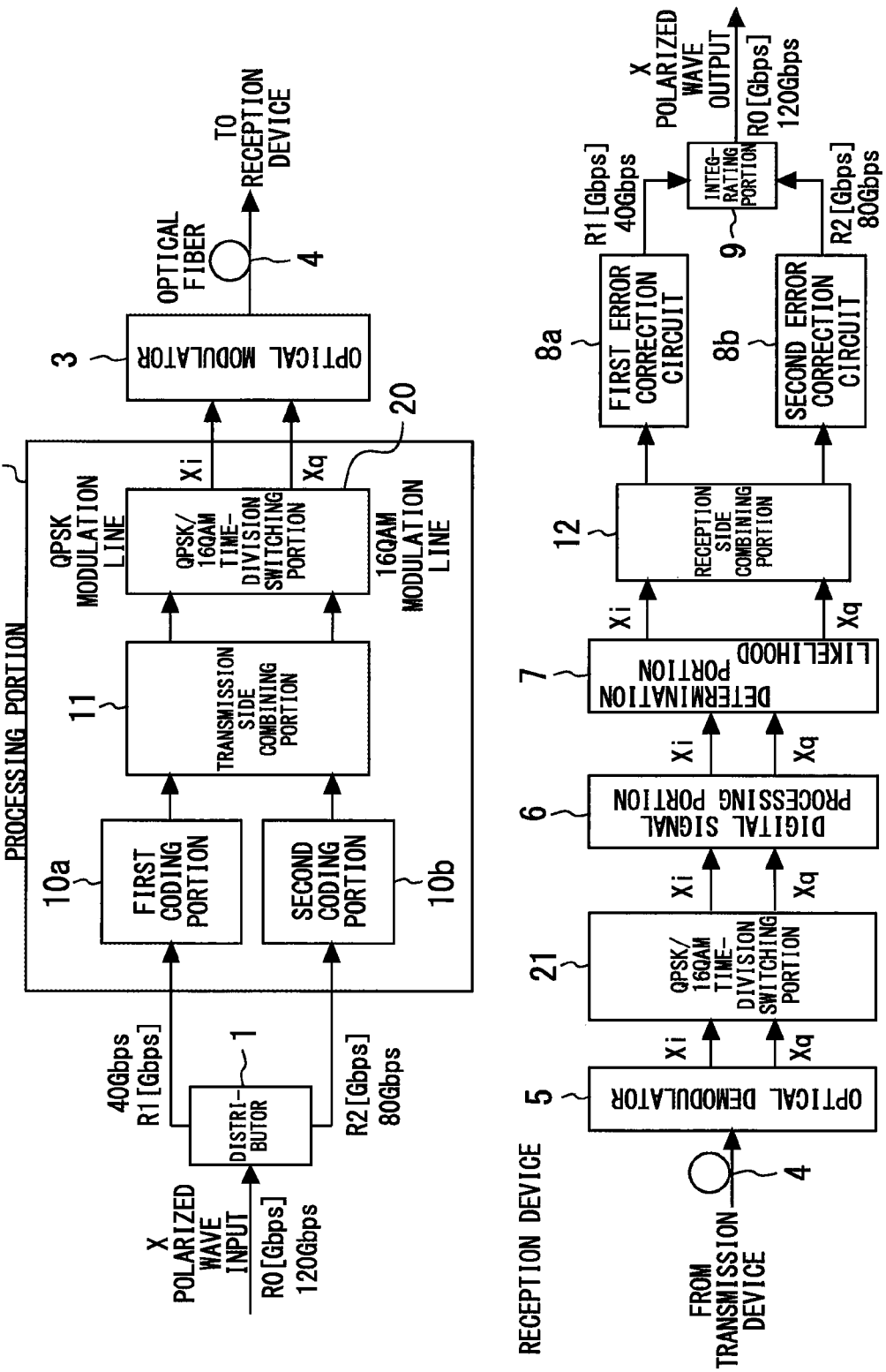

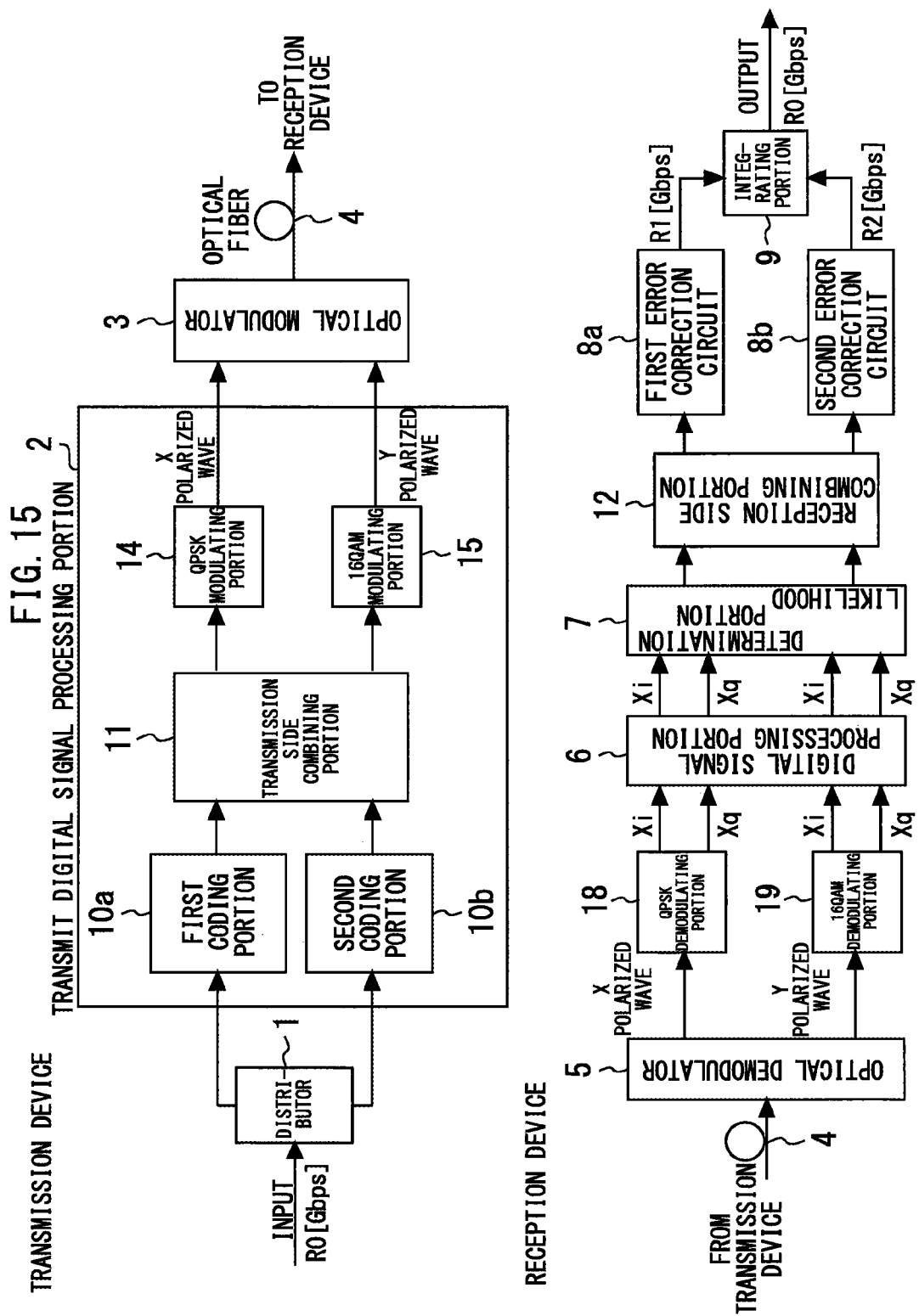

ERROR CORRECTION DEVICE, ERROR CORRECTION METHOD, AND COMMUNICATION DEVICE

CROSS REFERENCE TO RELATED APPLICATIONS

This application is a National Phase application under 35 U.S.C. 371, of international application No. PCT/JP2017/045125, filed on Dec. 15, 2017, now pending, which claims foreign priority to Japanese Patent Application No. 2017-030818, filed on Feb. 22, 2017, the contents of each are herein wholly incorporated by reference.

FIELD

The present invention relates to an error correction device, an error correction method, and a communication device, which can improve overall transmission characteristics while suppressing power consumption.

BACKGROUND

In coherent optical communication, for improvement of transmission characteristics, distortion, and frequency/phase fluctuation that occur during transmission are compensated by digital signal processing. For further improvement of the transmission characteristics, an error correction circuit is provided between transmission and reception in addition to the above compensation function so that data errors in the transmission characteristics are reduced (for example, see NPL 1). In general, coding for error correction is performed for data on a transmission side, and error correction is performed on a reception side according to the coding.

CITATION LIST

Non Patent Literature

Summary Report "R&D on the Digital Coherent Signal Processing Technology for Large-capacity Optical Communication Networks"; Senichi Suzuki et al.; The Journal of the Institute of Electronics, Information and Communication Engineers, Vol. 95, No. 12, 2012, pp. 1100-1116

SUMMARY

Technical Problem

However, in a conventional communication device, in order to improve overall transmission characteristics, it is necessary not only to improve transmission characteristics between modulation and demodulation but also to use an error correction circuit with a high error correction capability to further reduce errors of reproduced data itself. However, as for the error correction circuit with a high error correction capability, a circuit scale is generally large, and power consumption is also large. Therefore, a communication device with a high error correction capability has a problem that power consumption is large.

The present invention has been made to solve the problem as described above, and its object is to obtain an error correction device, an error correction method, and a communication device, which can improve overall transmission characteristics while suppressing power consumption.

Solution to Problem

An error correction device according to the present invention used in a communication device transmitting data of a predetermined transmission rate through a plurality of transmission lines configured in one carrier or one channel band, includes: a plurality of error correction circuits correcting errors of the data transmitted through the plurality of transmission lines; and a combining portion combining the plurality of transmission lines to the plurality of error correction circuits, the plurality of transmission lines includes a first transmission line, and a second transmission line having a lower transmission characteristic than the first transmission line, wherein the plurality of error correction circuits include a first error correction circuit, and a second error correction circuit having lower error correction capability and power consumption than the first error correction circuit, and the combining portion uses a function of redundantly combining a plurality of error correction circuits in one transmission line, combines the first transmission line with the second error correction circuit at a higher rate than the first error correction circuit, and combines the second transmission line with the first error correction circuit at a higher rate than the second error correction circuit.

Advantageous Effects of Invention

The present invention makes it possible to improve overall transmission characteristics while suppressing power consumption.

BRIEF DESCRIPTION OF THE DRAWINGS

FIG. 6 is a diagram showing an example of transmission lines.

FIG. 7 is a diagram showing a communication device according to a second embodiment of the present invention.

FIG. 14 is a diagram showing a communication device according to a fifth embodiment of the present invention.

FIG. 15 is a diagram showing a communication device according to a sixth embodiment of the present invention.

DESCRIPTION OF EMBODIMENTS

An error correction device, an error correction method, and a communication device according to the embodiments of the present invention will be described with reference to the drawings. The same components will be denoted by the same symbols, and the repeated description thereof may be omitted.

First Embodiment

Figure 1:
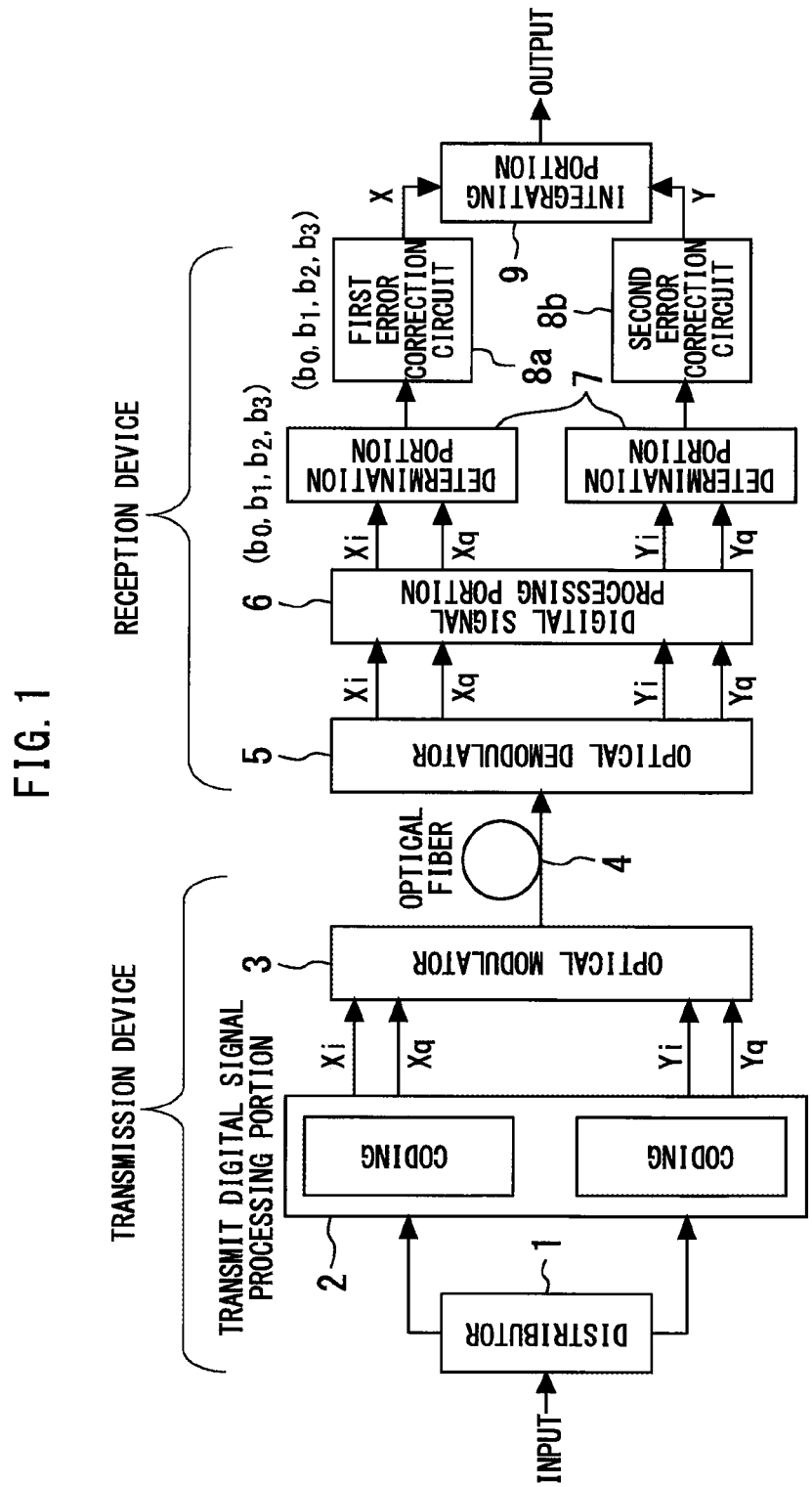
FIG. 1 is a diagram showing a communication device according to a first embodiment of the present invention.

FIG. 1 is a diagram showing a communication device according to a first embodiment of the present invention. Here, description will be made on a case where transmission data is divided in two polarized waves (an X polarized wave, a Y polarized wave) and transmitted.

In a transmission device, data is distributed to the two X and Y polarized waves by a distributor 1, and coding for error correction is performed for each by a transmit digital signal processing portion 2. The coding differs according to a method for error correction. Each piece of coded transmission data is transferred to an optical fiber 4 via an optical modulator 3. Note that various kinds of digital signal processing are performed for the pieces of transmission data before being coded.

In a reception device, received data is separated into received data of the X polarized wave and received data of the Y polarized wave by an optical demodulator 5 and sent to a digital signal processing portion 6. Here, the received data of the X polarized wave is indicated by coordinate data (Xi, Xq) on signal space, and the received data of the Y polarized wave is indicated by coordinate data (Yi, Yq) on the signal space.

The digital signal processing portion 6 compensates chromatic dispersion, polarization dispersion, and frequency/phase fluctuation that have occurred during transmission, by digital signal processing. For each polarized wave, the compensated received data is supplied to a determination portion 7, and a determination is performed from coordinate data to digital data. In this case, the digital data is calculated in a format depending on a method for error correction to be connected next. For example, there may be a case where likelihood information showing certainty of the data is added.

The digital data from the determination portion 7 (including the likelihood information depending on cases) is supplied to first and second error correction circuits 8a, 8b, and error correction is performed. Accordingly, an error rate characteristic is improved. Lastly, an integrating portion 9 integrates the data on the X polarized wave side and the data on the Y polarized wave side.

Figure 2:
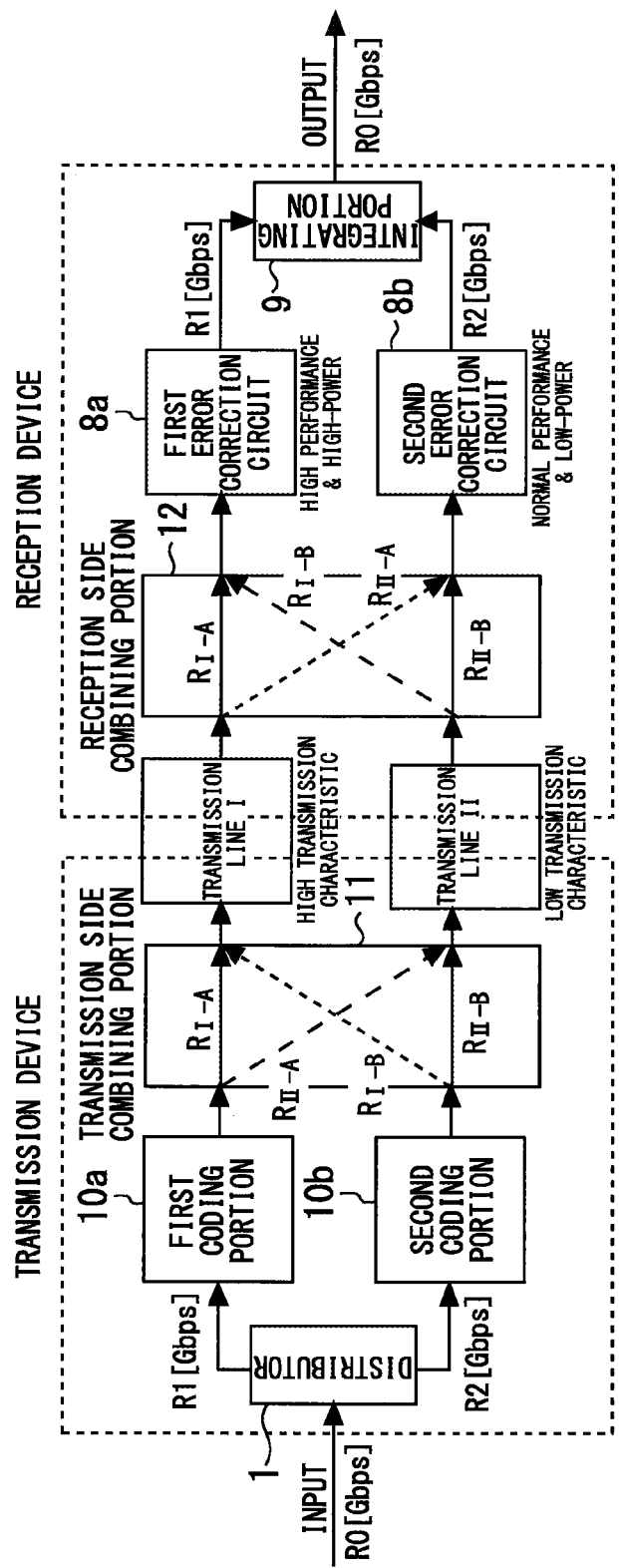
FIG. 2 is a diagram showing an error correction device used for the communication device according to the first embodiment of the present invention.

FIG. 2 is a diagram showing an error correction device used for the communication device according to the first embodiment of the present invention. Only portion related to the error correction device is extracted from the communication device of FIG. 1. First and second coding portions 10a, 10b and a transmission side combining portion 11 are included in the transmit digital signal processing portion 2 of FIG. 1. A reception side combining portion 12 is included in the digital signal processing portion 6 of FIG. 1. The first and second coding portions 10a, 10b and the first and second error correction circuits 8a, 8b configure FEC (Feedforward Error Correction).

In this description, the term "combine" also includes the meaning of "connect" and "couple".

Transmission lines I, II are a plurality of transmission lines configured in one carrier such as light from one optical fiber or one laser and integrally indicate the transmission device, a transmission medium, and the reception device. For example, in a case where QPSK (Quadrature Phase Shift Keying) modulated data and 16QAM (Quadrature Amplitude Modulation) modulated data are transmitted on one optical carrier, transmission by QPSK is indicated by the transmission line I, and transmission by 16QAM is indicated by the transmission line II. Note that the present invention is not limited to an optical carrier but is applicable to all communications including optical communication. Therefore, one carrier can be referred to as one channel band. Further, in the case of transmitting the plurality of transmission lines I, II by different carriers, the present invention can be also applied.

In this description, the term "line" also includes the meaning of "path".

The first and second coding portions 10a, 10b on the transmission side perform certain coding processing for a series of bit data with a certain length (a coding length) out of the pieces of transmission data and output the bit data as code words. This coding processing differs according to error correction methods, the coding processing being giving a predetermined rule to the data itself, adding related bits obtained from the data, or the like. The processing may be performed for each predetermined data length or may be continuously performed.

The first and second error correction circuits 8a, 8b on the reception side detect bits estimated to be erroneous, from the coded data (the code words) and correct the bits. The error correction is performed for each coding length (code word), and there may be a case where the coding length is hundreds of bytes to thousands of bytes.

The first and second coding portions 10a, 10b and the transmission lines I, II are combined by the transmission side combining portion 11 according to a set ratio. The transmission line I, II and the first and second error correction circuits 8a, 8b are combined by the reception side combining portion 12 according to a set ratio. In this case, the combination is not one-to-one combination but plurality-to-plurality combination. Each of the code words coded by the first and second coding portions 10a, 10b is assigned to any of the plurality of transmission line I, II. However, one code word may be divided and assigned to the plurality of transmission lines I, II. In the following description, the term "assign" also includes the meaning of the term "allocate".

Here, the transmission line I is a transmission line having a high transmission characteristic that is relatively invulnerable to noise, and the transmission line II is a transmission line having a low transmission characteristic that is more vulnerable to noise than the transmission line I. For example, if the transmission line I is a transmission line by QPSK, and the transmission line II is a transmission line by 16QAM, then the transmission line I is better than the transmission line II in the transmission characteristic.

Further, as for the first error correction circuit 8a, though the error correction capability is relatively high, the circuit scale and power consumption are large. As for the second error correction circuit 8b, though the error correction capability is lower than the first error correction circuit 8a, the circuit scale and power consumption are small. For example, the first error correction circuit 8a performs error correction by LDPC (Low Density Parity Check) codes, and the second error correction circuit 8b performs error correction by Reed-Solomon codes. In general, LDPC codes have a higher error correction capability than Reed-Solomon codes, and the circuit scale and power consumption are larger. Of course, in the same error correction method, the characteristic difference described above can be configured according to a code length and the like. Note that the error correction method is not limited to the method described above, and other error correction methods such as convolutional coding and Viterbi decoding are also possible.

Figure 3:
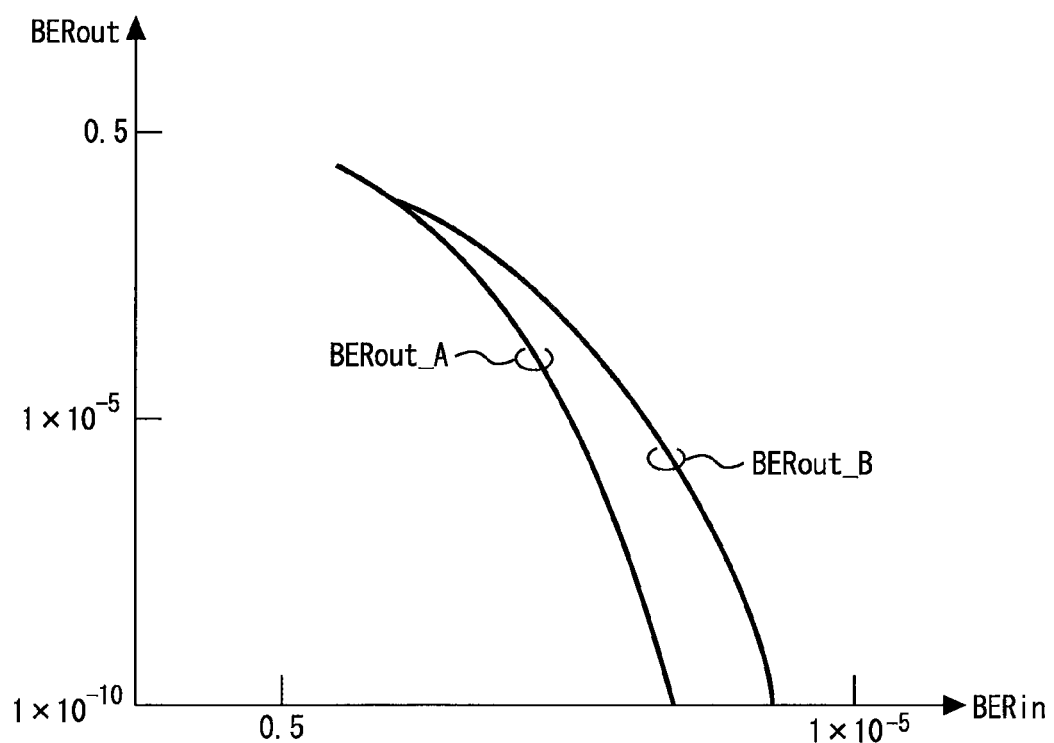
FIG. 3 is a diagram showing correction operations of the first and second error correction circuits.

FIG. 3 is a diagram showing correction operations of the first and second error correction circuits. A horizontal axis indicates an error rate BERin before error correction is performed, and a vertical axis indicates an error rate BERout after error correction is performed. The BER (Bit Error Rate) is an error rate for each bit. An error correction operation FEC_A [BERin] by the first error correction circuit 8a and an error correction operation FEC_B [BERin] by the second error correction circuit 8b are indicated by the following formulas:

BERout_A=FEC_A[BERin]

BERout_B=FEC_B[BERin]

An error correction effect is shown by the error rate BERout of output decreasing more than the error rate BERin of input. For an error rate BERin of the same input, an error rate BERout_A of output of the first error correction circuit 8a is smaller than an error rate BERout_B of output of the second error correction circuit 8b. This shows that the first error correction circuit 8a has a higher error correction capability than the second error correction circuit 8b.

Figure 4:
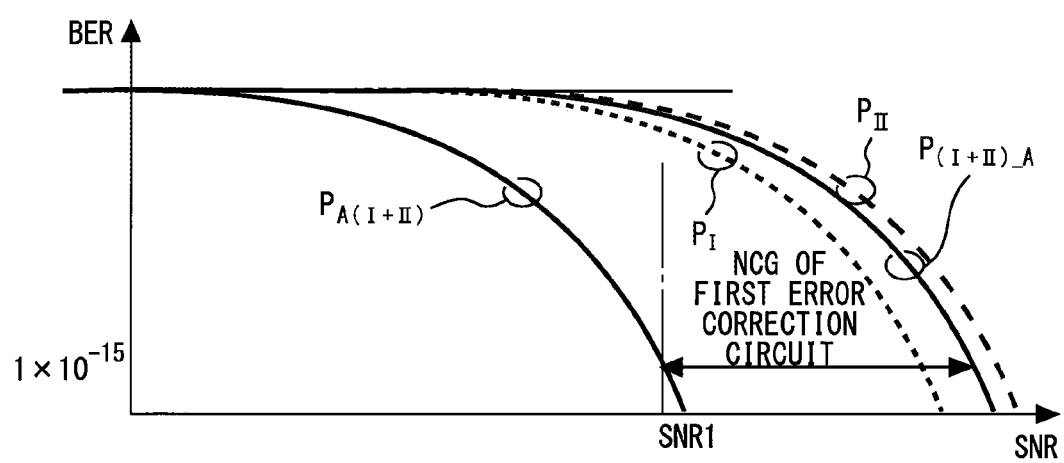
FIG. 4 is a diagram showing error rate characteristics of the error correction device of the present invention.
Figure 5:
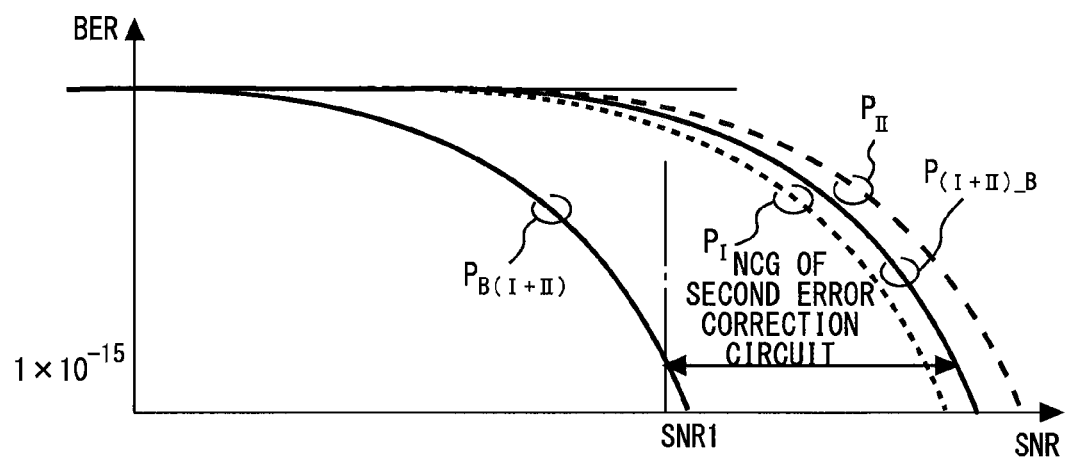
FIG. 5 is a diagram showing error rate characteristics of the error correction device of the present invention.

FIGS. 4 and 5 are diagrams showing error rate characteristics of the error correction device of the present invention. In FIGS. 4 and 5, an error rate characteristic $P_I$ of the transmission line I and an error rate characteristic $P_{II}$ of the transmission line II are common. FIG. 4 further shows an overall transmission line error rate characteristic $P_{(I+II)\_A}$ (before error correction) of the transmission lines I, II to be combined with the first error correction circuit 8a, and an error rate characteristic $P_{A(I+II)}$ (after error correction) when the transmission lines I, II are combined with the first error correction circuit 8a. FIG. 5 further shows an overall transmission line error rate characteristic $P_{(I+II)\_B}$ (before error correction) of the transmission lines I, II to be combined with the second error correction circuit 8b, and an error rate characteristic $P_{B(I+II)}$ (after error correction) when the transmission lines I, II are combined with the second error correction circuit 8b. SNR is a signal-to-noise ratio. For example, if the transmission line I is for transmission by QPSK, and the transmission line II is for transmission by 16QAM, then the error rate characteristic $P_I$ of the transmission line I is better than the error rate characteristic $P_{II}$ of the transmission line II. Note that FIGS. 4 and 5 are image diagrams and may be different from actual error rate characteristics.

When it is assumed that, in the distributor 1, out of a transmission rate R1 [Gbps] assigned to the first coding portion 10a, a transmission rate to be combined with the transmission line I is $R_{I\_A}$ [Gbps], and a transmission rate to be combined with the transmission line II is remaining $R_{II\_A}$ [Gbps], the overall transmission line error rate characteristic $P_{(I+II)\_A}$ is shown by the following formula:

$$P_{(I+II)\_A} = \frac{R_{I\_A}}{R1}P_I + \frac{R_{II\_A}}{R1}P_{II} \qquad \text{[Math. 1]}$$

Furthermore, if they are combined with the first error correction circuit 8a, the error rate characteristic $P_{A(I+II)}$ is shown by the following formula:

$P_{A(I+II)}$=FEC_A[$P_{(I+II)\_A}$]

In FIG. 3, a state in which the error rate itself is improved by FEC_A is shown. The error rate characteristic $P_{A(I+II)}$ for an input SNR becomes a curve drawn by a solid line on a left side of FIG. 4. Here, the overall transmission line error rate characteristic $P_{(I+II)\_A}$ before error correction is performed is a curve drawn by a solid line on a right side of FIG. 4. A difference between input SNRs for the same error rate shows the error correction capability of the first error correction circuit 8a. In general, this is an indicator showing an error correction capability, which is referred to as NCG (Net Coding Gain).

Similarly, when it is assumed that, in the distributor 1, out of a transmission rate R2 [Gbps] assigned to the second coding portion 10b, a transmission rate to be combined with the transmission line I is $R_{I\_B}$ [Gbps], and a transmission rate to be combined with the transmission line II is remaining $R_{II\_B}$ [Gbps], the overall transmission line error rate characteristic $P_{(I+II)\_B}$ is shown by the following formula:

$$P_{(I+II)\_B} = \frac{R_{I\_B}}{R2}P_I + \frac{R_{II\_B}}{R2}P_{II} \qquad \text{[Math. 2]}$$

Furthermore, if they are combined with the second error correction circuit 8b, the error rate characteristic $P_{B(I+II)}$ is shown by the following formula:

$P_{B(I+II)}$=FEC_B[$P_{(I+II)\_B}$]

NCG of the second error correction circuit 8b is smaller than NCG of the first error correction circuit 8a.

The transmission side combining portion 11 and the reception side combining portion 12 perform similar operations in synchronization with each other. That is, the transmission side combining portion 11 distributes output data of the first coding portion 10a to the transmission line I and the transmission line II and distributes output data of the second coding portion 10b to the transmission line I and the transmission line II. The reception side combining portion 12 combines the data from the first coding portion 10a distributed to the transmission line I and the transmission line II with the first error correction circuit 8a and combines the data from the second coding portion 10b distributed to the transmission line I and the transmission line II with the second error correction circuit 8b.

Here, at the time of distributing code words which are output data of the first coding portion 10a or the second coding portion 10b to the plurality of transmission lines I, II, the transmission side combining portion 11 can not only distribute the code words in units of coding (that is, for each code word) but also distribute data in the code words to the transmission lines I, II. This distribution can be performed in units of several bits. Accordingly, even when a coding length is long or when continuous coding is performed, combination with the plurality of transmission lines easily becomes possible, and precise adjustment of a ratio of distribution becomes possible. Note that, in the case of distributing data in coding, calculation of an overall error rate is nonlinear and complicated. A method for the calculation will be shown in description of an operation below.

Next, a whole operation will be described. Input data of an overall data rate R0 [Gbps] is distributed as R1 [Gbps] data to be supplied to the first coding portion 10a and R2 [Gbps] data to be supplied to the second coding portion 10b. A ratio of this distribution is a part of an algorithm for a method for subsequent combination by the transmission side combining portion 11. Each of the pieces of data coded by the first and second coding portions 10a, 10b are supplied to the transmission side combining portion 11. Here, though, generally, an information amount of data may change by coding, it is indicated by the same transmission rate here for simplification of description. The transmission side combining portion 11 supplies data of $R_{I\_A}$ [Gbps] out of the data of R1 [Gbps] to the transmission line I and supplies remaining data of $R_{II\_A}$ [Gbps] to the transmission line II. Furthermore, the transmission side combining portion 11 supplies data of $R_{I\_B}$ [Gbps] out of the data of R2 [Gbps] to the transmission line I and supplies remaining data of $R_{II\_B}$ [Gbps] to the transmission line II.

Next, each of the pieces of data transmitted through the transmission line I and the transmission line II is supplied to the reception side combining portion 12. The reception side combining portion 12 combines the data of $R_{I\_A}$ [Gbps] with the first error correction circuit 8a out of the data from the transmission line I and combines the remaining data of $R_{I\_B}$ [Gbps] with the second error correction circuit 8b. Furthermore, the reception side combining portion 12 combines the data of $R_{II\_A}$ [Gbps] with the first error correction circuit 8a out of the data from the transmission line II and combines the remaining data of $R_{II\_B}$ [Gbps] with the second error correction circuit 8b.

Lastly, the data of R1 [Gbps] reproduced by the first error correction circuit 8a is output, and the data of R2 [Gbps] reproduced by the second error correction circuit 8b is output. The integrating portion 9 integrates these and outputs data of R0 [Gbps].

Here, an overall error characteristic $P_T$ of the whole system is determined by the following formula from the error rate characteristic $P_{A(I+II)}$ in a case where the first error correction circuit 8a is combined with the plurality of transmission lines I, II, the error rate characteristic $P_{B(I+II)}$ in a case where the second error correction circuit 8b is combined with the plurality of transmission lines I, II, and distribution rates R1/R0 and R2/R0 thereof. Here, R0=R1+R2, R1=$R_{I\_A}$+$R_{II\_A}$ and R2=$R_{I\_B}$+$R_{II\_B}$ are assumed. Note that the ratio of distribution is set for the reception side combining portion 12 in advance.

$$P_T = \frac{R1}{R0} p_{A(I+II)} + \frac{R2}{R0} p_{B(I+II)} = \quad \text{[Math. 3]}$$

$$\frac{R1}{R0} \cdot \text{FEC\_A}\left[\frac{R_{I\_A}}{R1} P_I + \frac{R_{II\_A}}{R1} P_{II}\right] +$$

$$\frac{R2}{R0} \cdot \text{FEC\_B}\left[\frac{R_{I\_B}}{R1} P_I + \frac{R_{II\_B}}{R1} P_{II}\right]$$

A method of distributing data in the combining portion will be described below. At the time of distribution of data in the combining portion, power consumption of the whole device can be reduced by using the low-power second error correction circuits 8b more often. However, it is desirable that data transmitted through the transmission line I with a high transmission characteristic is combined with the second error correction circuit 8b with a relatively low error correction capability. On the other hand, it is desirable that data transmitted through the transmission line II with a low transmission characteristic is combined with the first error correction circuit 8a with a high error correction capability. At this time, by performing adjustment so that the error rate characteristic $P_{A(I+II)}$ and the error rate characteristic $P_{B(I+II)}$ are almost the same characteristics as shown in FIGS. 4 and 5, optimization design becomes easy. At this time, by adjusting transmission power together, the design becomes further easier. Though adjustment of transmission power is not especially mentioned below, adjustment of transmission power is also included in design.

Table 1 shows an example in which input data 120 [Gbps] is assigned according to the above policy. Table 1 shows a transmission rate for each of a case where the transmission line I and the first error correction circuit 8a are combined, a case where the transmission line I and the second error correction circuit 8b are combined, a case where the transmission line II and the first error correction circuit 8a are combined, and a case where the transmission line II and the second error correction circuit 8b are combined.

TABLE 1

| Rate [Gbps] | First error correction circuit | Second error correction circuit | Subtotal |
| --- | --- | --- | --- |
| Transmission line I | $R_{I\_A}$: 0 | $R_{I\_B}$: 60 | 60 |
| Transmission line II | $R_{II\_A}$: 40 | $R_{II\_B}$: 20 | 60 |
| Total | R1: 40 | R2: 80 | R0: 120 |

The overall error rate $P_T$ at this time is indicated by the following formula:

$$P_T = \quad \text{[Math. 4]}$$

$$\frac{40}{120} \cdot \text{FEC\_A}\left[\frac{0}{40}P_I + \frac{40}{40}P_{II}\right] + \frac{80}{120} \cdot \text{FEC\_B}\left[\frac{60}{80}P_I + \frac{20}{80}P_{II}\right]$$

Note that a method for combining a plurality of transmission lines and a plurality of error correction circuits, that is, a method for distributing data is decided in consideration of the overall error rate $P_T$ and total power. Specifically, an allowable value for an error rate in the case of combining all with the first error correction circuit 8a with a high error correction capability is determined, and the rate of combination with the low-power second error correction circuits 8b is increased so that the overall error rate $P_T$ is within the allowable value.

As described above, at the time of transmitting data, it is desirable to use a low-power error correction circuit with a conventional performance as far as possible for power consumption reduction. On the other hand, it is desirable to use a high-power error correction circuit with a high performance as far as possible for transmission characteristics improvement. Therefore, in the present embodiment, the transmission line I with a high transmission characteristic is combined with the second error correction circuit 8b with a low correction capability and low power consumption at a ratio larger than that of the first error correction circuit 8a, and the transmission line II with a low transmission characteristic is combined with the first error correction circuit 8a with a high correction capability and high power consumption at a ratio larger than that of the second error correction circuit 8b. Accordingly, it is possible to improve overall transmission characteristics while suppressing power consumption.

Further, in general, in a plurality of carriers or a plurality of channel bands, a plurality of transmission lines corresponding to a plurality of modulation schemes or a plurality of transmission characteristics are configured, respectively. In the present embodiment, however, a plurality of transmission lines are configured in one carrier or one channel band. Note that one channel band is synonymous with one carrier (carrier wave). However, in a scheme in which a plurality of subcarriers are configured, like OFDM (Orthogonal Frequency Division Multiplexing), the plurality of subcarriers of OFDM are transmitted by one carrier, and, therefore, a bundle of the plurality of subcarriers is regarded as one carrier or one channel.

Further, one code word which is a series of outputs coded by FEC is assigned to a plurality of transmission lines. For example, one code word is assigned to the transmission line I and the transmission line II. There is a method in which each code word is assigned to a separate transmission line (for example, a first code word is assigned to the transmission line I, and a second code word is assigned to the transmission line II). However, as a code length increases, there may be a case where precise adjustment of assignment cannot be performed.

FIG. 6 is a diagram showing an example of transmission lines. The plurality of transmission lines are configured in one carrier or one channel band. Example 1 shows a method of, by utilizing that a high-order bit and a low-order bit among multi-leveled bits are different in the transmission characteristic, configuring them as a plurality of transmission lines. For example, in 16QAM in which data is shown by four bits, the high order two bits are relatively more vulnerable to the low order two bits to noise. Examples 2 to 4 show methods in which a plurality of modulation schemes (for example, QPSK modulation and 16QAM modulation) are configured as a plurality of transmission lines. For example, between the QPSK modulation and the 16QAM modulation, the QPSK modulation is relatively more invulnerable to the 16QAM modulation to noise. In Example 2, the modulation scheme is changed for each OFDM subcarrier. In Example 3, the modulation scheme is changed in time division. In Example 4, the modulation scheme is changed for each polarized wave. Description will be made on these examples of transmission lines in detail in the second to sixth embodiments below.

Second Embodiment

FIG. 7 is a diagram showing a communication device according to a second embodiment of the present invention. The present embodiment is a communication device applied to coherent optical communication. In general, coherent optical communication is configured with transmissions by the X polarized wave and the Y polarized wave. Since a transmission configuration by the Y polarized wave is similar to a transmission configuration of the X polarized wave, only the transmission by the X polarized wave is shown here, and the transmission configuration by the Y polarized wave is omitted.

In a transmission device, after input data is coded by the first and second coding portions 10a, 10b and is combined with a plurality of transmission lines by the transmission side combining portion 11. The data combined with the plurality of transmission lines is multi-leveledly modulated by a mapping circuit 13 and output from the optical modulator 3 as an optical signal. Note that though a series of digital signal processing is generally performed in the transmission device, it is omitted here.

In a reception device, after the optical demodulator 5 converts the received signal from the optical signal to an electrical signal, the digital signal processing portion 6 performs digital signal processing. The determination portion 7 converts the output from coordinate data to bit data and divides the bit data into pieces of data for a plurality of transmission lines. The pieces of data are combined with the first and second error correction circuits 8a, 8b via the reception side combining portion 12.

In the present embodiment, two transmission lines and two FECs are combined to transmit data. As the FECs, the high-power first error correction circuit 8a with a high performance and the low-power second error correction circuit 8b with a conventional performance are used. Furthermore, in the present embodiment, by utilizing that a high-order bit and a low-order bit among multi-leveled bits are different in the transmission characteristic, they are configured as a plurality of transmission lines. A method therefor will be described below.

Figure 8:
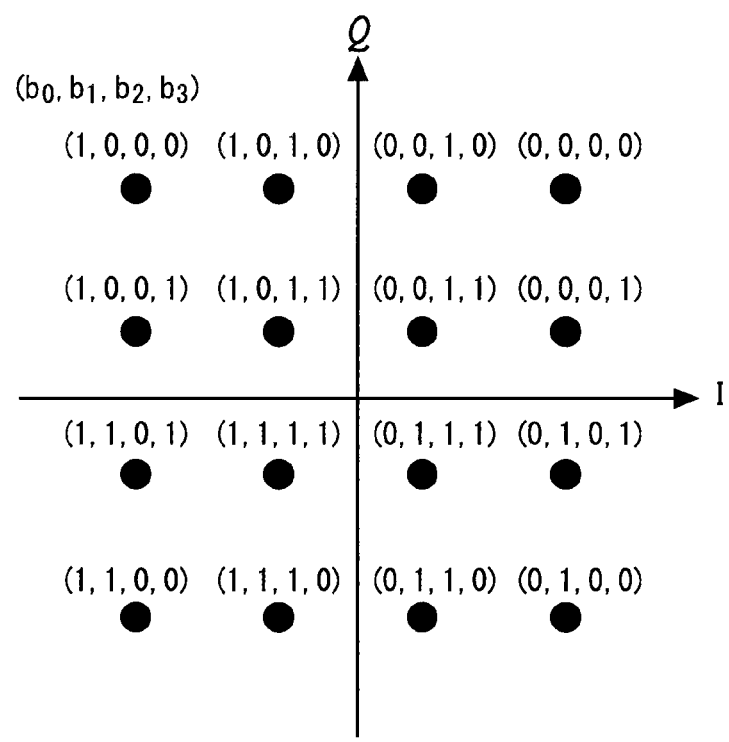
FIG. 8 is a diagram showing an example of signal mapping of 16QAM used in the second embodiment of the present invention.
Figure 9:
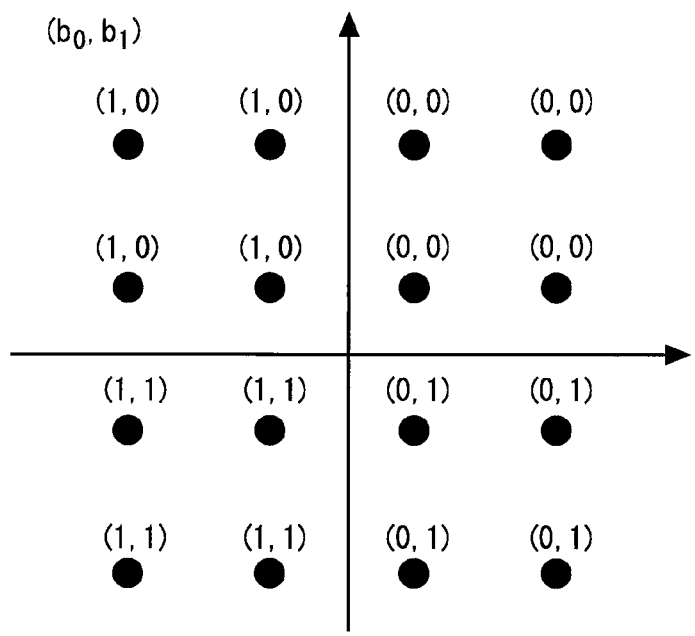
FIG. 9 is a diagram showing an example of signal mapping of 16QAM used in the second embodiment of the present invention.
Figure 10:
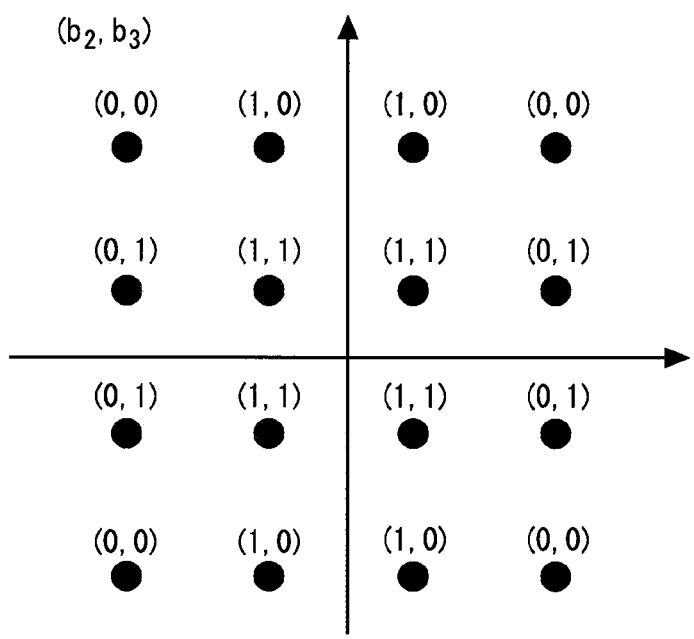
FIG. 10 is a diagram showing an example of signal mapping of 16QAM used in the second embodiment of the present invention.

FIGS. 8 to 10 are diagrams showing an example of signal mapping of 16QAM used in the second embodiment of the present invention. However, the mapping shown here is an example, and mapping is not limited thereto. In 16QAM, for input data, sixteen signal points are assigned for every four bits (b0, b1, b2, b3). Here, (b0, b1) are defined as high-order bits, and (b2, b3) are defined as low-order bits. FIG. 9 is a diagram displaying only the high-order bits (b0, b1), and FIG. 10 is a diagram displaying only the low-order bits (b2, b3).

When the high-order bits shown in FIG. 9 are focused on, four signal points in each quadrant are indicated by the same values. For example, all of values of four signal points in the first quadrant are (0, 0). On the other hand, when the low-order bits shown in FIG. 10 are focused on, four signal points in each quadrant are indicated by different values. For example, all of values of four signal points in the first quadrant are (1, 1), (0, 1), (1, 0) and (0, 0). In this case, an average distance between signal points with different values (e.x. (0,0) and (1,0)) in transmission by the high-order bits is larger than an average distance between signal points with different values (e.x. (0,0) and (1,0)) in transmission by the low-order bits. These distances are related to strength of resistance against noise that causes a data error. Therefore, it is seen that, in transmission by the high-order bits, the strength of resistance against noise is larger, and the transmission characteristic is better than in transmission by the low-order bits.

Utilizing this, the transmission line I is configured with transmission by the high-order bits, and the transmission line II is configured with transmission by the low-order bits. Specifically, the transmission side combining portion 11 distributes data from the first and second coding portions 10a, 10b to the high-order bits (b0, b1) and the low-order bits (b2, b3) to supply the data to the mapping circuit 13. The reception side combining portion 12 assigns the high-order bits (b0, b1) and the low-order bits (b2, b3) of the data from the determination portion 7, to the first and second error correction circuits 8a, 8b in a method opposite to the method of the transmission side combining portion 11. By this method, high-order bit transmission as the transmission line I and low-order bit transmission as the transmission line II can be freely combined with the first and second error correction circuits 8a, 8b.

Figure 11:
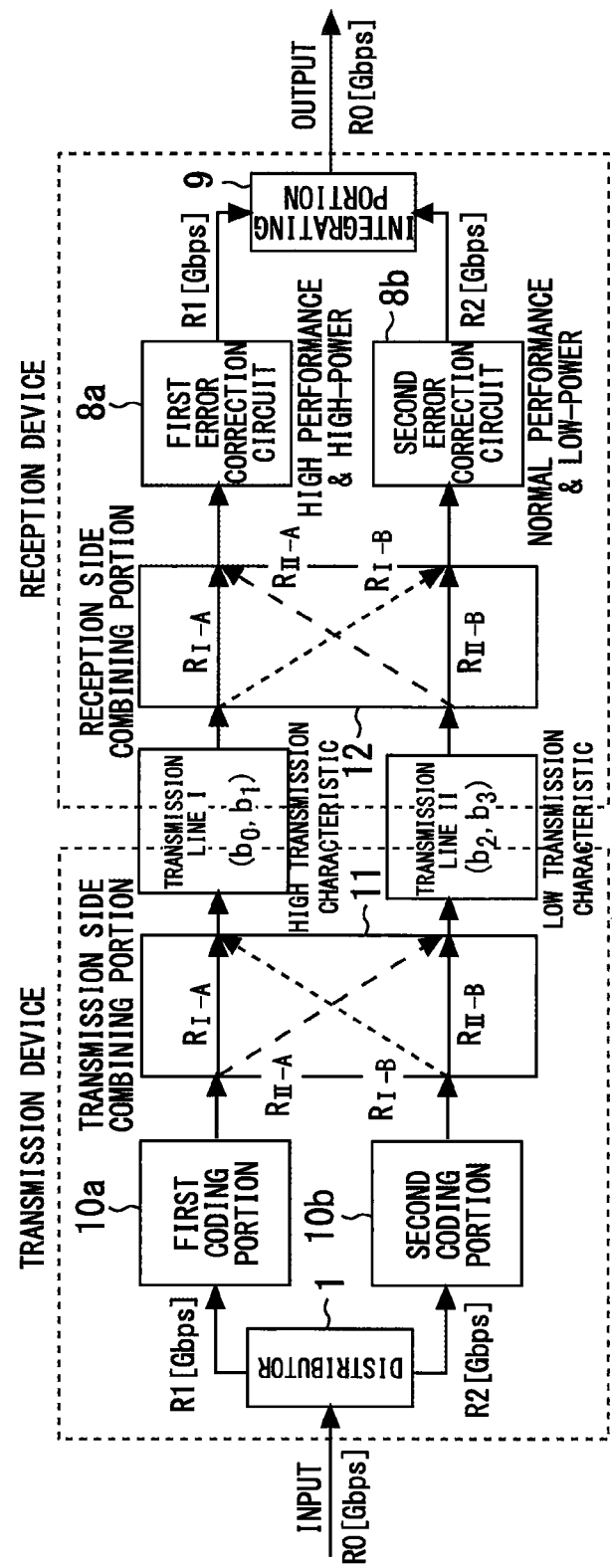
FIG. 11 is a diagram illustrating an operating principle of the communication device according to the second embodiment of the present invention.

FIG. 11 is a diagram illustrating an operating principle of the communication device according to the second embodiment of the present invention. An example of assignment at this time will be described below.

TABLE 2

| Rate [Gbps] | First error correction circuit | Second error correction circuit | Subtotal |
|---|---|---|---|
| Transmission line I (b0, b1) | $R_{I\_A}$: 0 | $R_{I\_B}$: 60 | 60 |
| Transmission line II (b2, b3) | $R_{II\_A}$: 40 | $R_{II\_B}$: 20 | 60 |
| Total | R1: 40 | R2: 80 | R0: 120 |

In the transmission device, by the distributor 1, input data of an overall data rate 120 Gbps is distributed as R1=40 Gbps data to be supplied to the first coding portion 10a and R2=80 Gbps data to be supplied to the second coding portion 10b. Each of the pieces of data coded by the first coding portion 10a and the second coding portion 10b is supplied to the transmission side combining portion 11. At this time, a data amount may increase. Here, however, it is assumed that the data amount is the same as the input data for simplification of description.

The transmission side combining portion 11 assigns all the output of 40 Gbps of the first coding portion 10a to the low-order bits (b2, b3) of mapping. Accordingly, the output 40 Gbps of the first coding portion 10a is combined with the transmission line I of the low-order bits. In this example, there is no assignment from the output of the first coding portion 10a to the high-order bits (b0, b1).

On the other hand, out of the output of 80 Gbps of the second coding portion 10b, data of 60 Gbps is assigned to the high-order bits (b0, b1) of mapping, and data of 20 Gbps is assigned to the low-order bits (b2, b3) of the mapping. After the mapping, both of high-order bit transmission and low-order bit transmission are 60 Gbps transmission, and transmission by 30G symbol/s is performed.

In the reception device, the high-order bits (b0, b1) of 60 Gbps and the low-order bits (b2, b3) of 60 Gbps are supplied to the reception side combining portion 12. At this time, likelihood information is added depending on error correction methods. The reception side combining portion 12 supplies all the data of the high-order bits of 60 Gbps to the second error correction circuit 8b. Further, out of the low-order bits of 60 Gbps, the data of 40 Gbps is supplied to the first error correction circuit 8a, and the data of 20 Gbps is supplied to the second error correction circuit 8b.

By the process described above, out of the input data of the overall data rate 120 Gbps, the data of 80 Gbps is assigned to the low-power second error correction circuit 8b, and the data of 40 Gbps is assigned to the high-power first error correction circuit 8a. Therefore, in comparison with the case where all the data is assigned to the high-power first error correction circuit 8a, drastic power consumption reduction can be achieved.

Further, the overall error rate $P_T$ can be calculated similarly to the first embodiment. Since the rate at which the transmission line II with a relatively low transmission characteristic is combined with the first error correction circuit 8a with a high error correction capability is increased, the overall error rate falls within an acceptable range. Accordingly, it is possible to improve overall transmission characteristics while suppressing power consumption.

Third Embodiment

Figure 12:
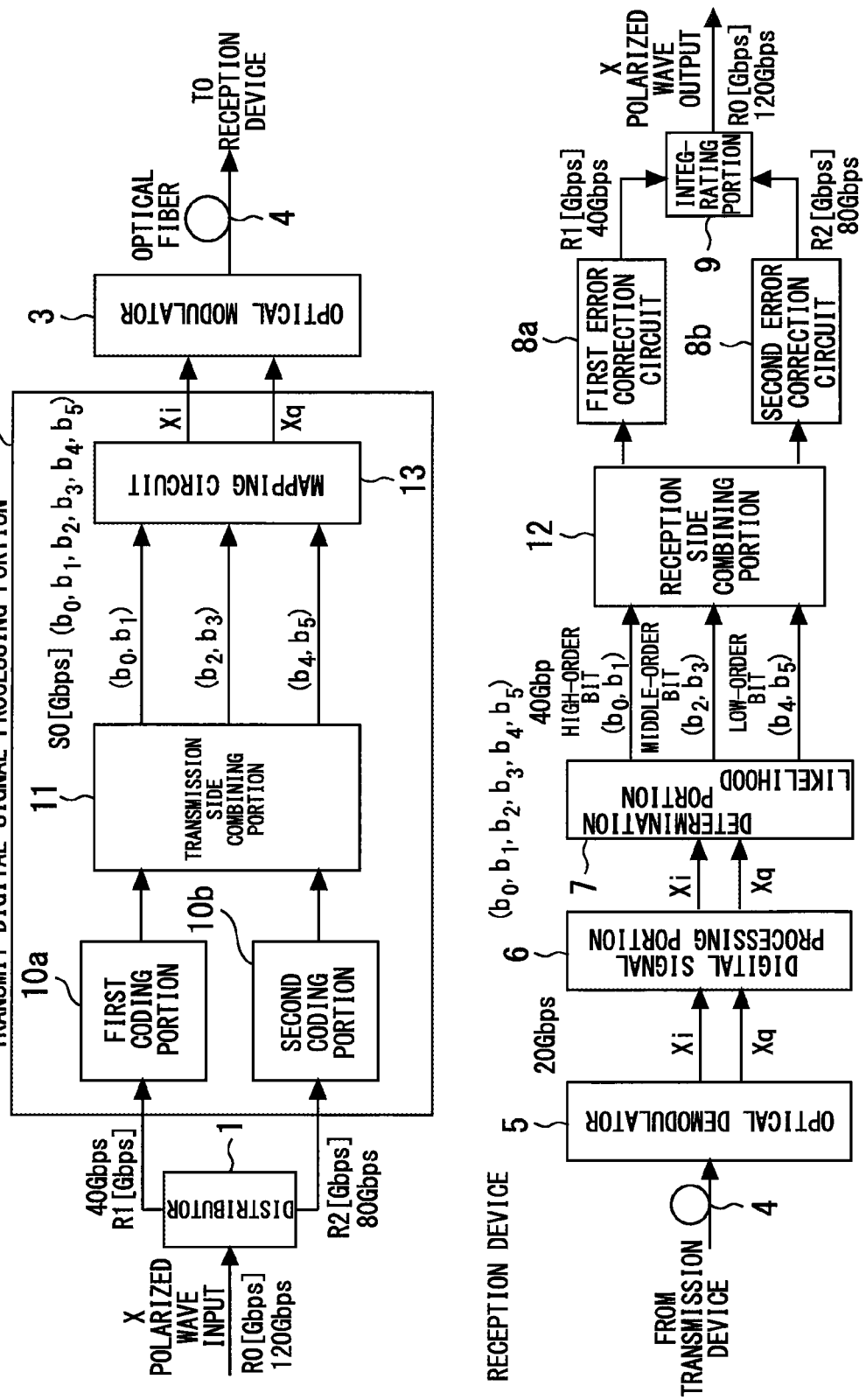
FIG. 12 is a diagram showing a communication device according to a third embodiment of the present invention.

FIG. 12 is a diagram showing a communication device according to a third embodiment of the present invention. In the present embodiment, in comparison with the communication device of 16QAM according to the second embodiment, the modulation scheme is changed to 64QAM. Other components are similar to components of the second embodiment.

In 64QAM modulation, sixty-four signal points are assigned for every six bits (b0, b1, b2, b3, b4, b5). Here, (b0, b1) are defined as high-order bits, (b2, b3) are defined as middle-order bits, and (b4, b5) are defined as low-order bits. Among high-order bit transmission, middle-order bit transmission, and low-order bit transmission, higher-order bit transmission has a better transmission characteristic, and the transmission line I, the transmission line II, and a transmission line III are respectively configured by high-order bit transmission, middle-order bit transmission, and low-order bit transmission, as in the case of 16QAM. Therefore, FEC coded data supplied from the transmission side combining portion 11 to the mapping circuit 13 is assigned to the three kinds of transmission bits (the high-order bits, the middle-order bits, and the low-order bits). The data supplied from the determination portion 7 to the reception side combining portion 12 on the reception side is also assigned in an opposite direction at the same rate as the transmission side. An example of the assignment will be described below. In the present embodiment also, the overall error rate can be determined similarly to the case of 16QAM.

TABLE 3

| Rate[Gbps] | First error correction circuit | Second error correction circuit | Subtotal |
|---|---|---|---|
| Transmission line I (b0, b1) | $R_{I\_A}$: 0 | $R_{I\_B}$: 40 | 40 |
| Transmission line II (b2, b3) | $R_{II\_A}$: 10 | $R_{II\_B}$: 30 | 40 |
| Transmission line III (b4, b5) | $R_{III\_A}$: 30 | $R_{III\_B}$: 10 | 40 |
| Total | R1: 40 | R2: 80 | R0: 120 |

In the present embodiment, out of input data of 120 Gbps, data of 80 Gbps is combined with the low-power second error correction circuit 8b, and drastic power consumption reduction can be achieved in comparison with the case where all the data is assigned to the high-power first error correction circuit 8a. Since the rate of the transmission line III with a relatively low transmission characteristic is combined with the first error correction circuit 8a with a high error correction capability, the overall error rate is within an acceptable range. Accordingly, it is possible to improve overall transmission characteristics while suppressing power consumption. Further, in a case where the number of multi-leveled bits is large like 64QAM, precise combination adjustment becomes possible, and it is easy to perform optimization of combination.

Fourth Embodiment

Figure 13:
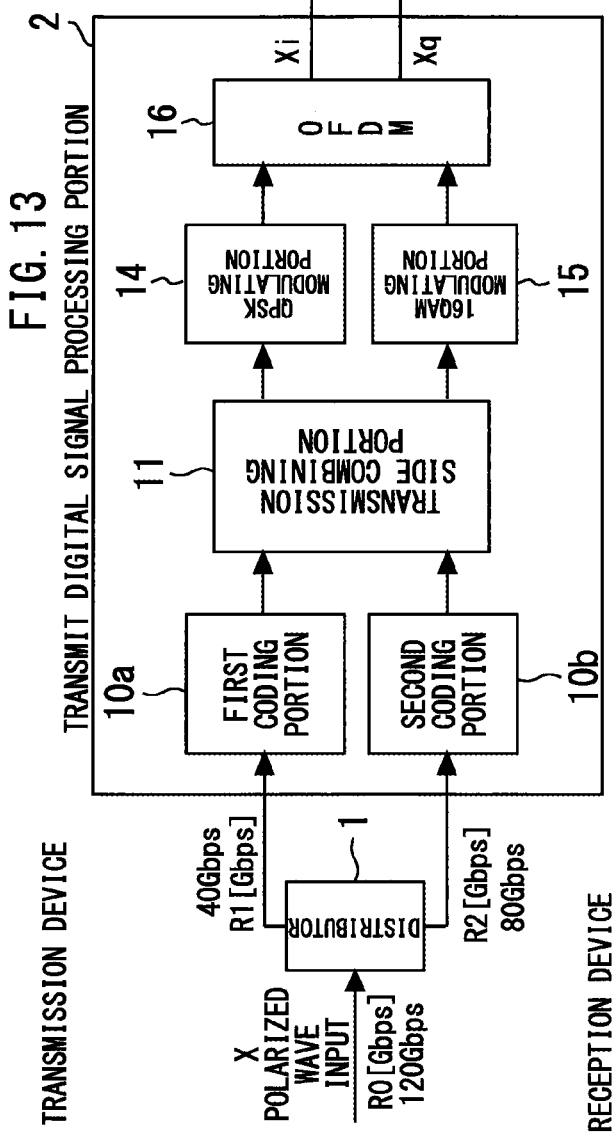
FIG. 13 is a diagram showing a communication device according to a fourth embodiment of the present invention.

FIG. 13 is a diagram showing a communication device according to a fourth embodiment of the present invention. In the present embodiment, the method for configuring the plurality of transmission lines is changed from the method of utilizing multi-leveled bits of the second embodiment to a method of switching a modulation scheme for each subcarrier of OFDM.

Data combined with the plurality of transmission lines by the transmission side combining portion 11 is modulated by a QPSK modulating portion 14 and a 16QAM modulating portion 15, and the data passes through an OFDM 16 and is output from the optical modulator 3 as an optical signal. In the reception device, an output signal of the optical demodulator 5 passes through an OFDM 17 and is demodulated by a QPSK demodulating portion 18 and a 16QAM demodulation portion 19.

In OFDM, input data is generally transmitted being divided for a plurality of subcarriers. At this time, by changing the modulation scheme according to the subcarriers, a plurality of transmission lines with different transmission characteristics can be configured. For example, QPSK-modulated data and 16QAM-modulated data can be transmitted by separate subcarriers. In general, QPSK modulation has a higher transmission characteristic than 16QAM modulation. Therefore, transmission by QPSK modulation corresponds to the transmission line I of the first embodiment, and transmission by 16QAM corresponds to the transmission line II.

A method for combining the first error correction circuit 8a with a high error correction capability and power consumption and the second error correction circuit 8b with a relatively low error correction capability and power consumption with the transmission line I and the transmission line II can be decided similarly to the first embodiment. An example of a method for the combination is shown below. An optimal combination method in the system is decided from the overall error rate and power consumption as described above.

TABLE 4

| Rate[Gbps] | First error correction circuit | Second error correction circuit | Subtotal |
|---|---|---|---|
| Transmission line I (QPSK@ subcarrier 1) | $R_{I\_A}$: 0 | $R_{I\_B}$: 60 | 60 |
| Transmission line II (QPSK@ subcarrier 2) | $R_{II\_A}$: 40 | $R_{II\_B}$: 20 | 60 |
| Total | R1: 40 | R2: 80 | R0: 120 |

Note that, in the case of configuring the plurality of transmission lines by subcarriers of OFDM, more transmission lines can be configured by using other modulation schemes (for example, BPSK (Binary Phase Shift Keying) or 64QAM). Further, since the number of subcarriers to be assigned can be arbitrarily changed, it is not necessary to cause the data rates of the transmission line I and the transmission line II to be the same.

Out of input data of 120 Gbps, data of 80 Gbps is combined with the low-power second error correction circuit 8b, and drastic power consumption reduction can be achieved in comparison with the case where all the data is assigned to the high-power first error correction circuit 8a. Further, the rate of the transmission line II (16QAM@subcarrier 2) with a relatively low transmission characteristic being combined with the first error correction circuit 8a with a high error correction capability increases. Accordingly, it is possible to improve overall transmission characteristics while suppressing power consumption. Further, since a plurality of modulation schemes having different transmission characteristics can be easily configured by the subcarriers of OFDM, more precise combination adjustment becomes possible, and it is easy to perform optimization of combination.

Fifth Embodiment

FIG. 14 is a diagram showing a communication device according to a fifth embodiment of the present invention. In the present embodiment, the method for configuring the plurality of transmission lines is changed from the method of switching a modulation scheme for each subcarrier of OFDM of the fourth embodiment to a method of switching among modulation schemes in time division.

Data combined with the plurality of transmission lines by the transmission side combining portion 11 passes through a QPSK/16QAM time-division switching portion 20 and is output from the optical modulator 3 as an optical signal. In the reception device, an output signal of the optical demodulator 5 passes through a QPSK/16QAM time-division switching portion 21 and is input to the digital signal processing portion 6.

When transmission frames are configured, data can be transmitted by a plurality of modulation schemes with different transmission characteristics in the frames or for each frame. Alternatively, a modulation scheme can be switched for each symbol or for every several symbols. Here, a symbol refers to a unit of a multi-leveled bit string (in QPSK, two bits=one symbol). For example, QPSK modulation and 16QAM modulation can be switched. In general, QPSK modulation has a higher transmission characteristic than 16QAM modulation. Therefore, transmission by QPSK modulation corresponds to the transmission line I of the first embodiment, and transmission by 16QAM corresponds to the transmission line II. In QPSK modulation and 16QAM modulation, transmission is performed in time division.

A method for combining the first error correction circuit 8a with a high error correction capability and power consumption and the second error correction circuit 8b with a relatively low error correction capability and power consumption with the transmission line I and the transmission line II can be decided similarly to the first embodiment. An example of a method for the combination is shown below. An optimal combination method in the system is decided from the overall error rate and power as described above.

TABLE 5

| Rate [Gbps] | First error correction circuit | Second error correction circuit | Subtotal |
|---|---|---|---|
| Transmission line I (QPSK@timeslot 1) | $R_{I\_A}$: 0 | $R_{I\_B}$: 60 | 60 |
| Transmission line II (QPSK@timeslot 2) | $R_{II\_A}$: 40 | $R_{II\_B}$: 20 | 60 |
| Total | R1: 40 | R2: 80 | R0: 120 |

Note that, in the case of configuring the plurality of transmission lines in time division, more transmission lines can be configured by using other modulation schemes (for example, BPSK or 64QAM). Further, it is not necessary to cause the data rates of the transmission line I and the transmission line II to be the same depending on assigned time. Furthermore, by changing transmission power and SNR for each modulation scheme, that is, for each transmission line, it becomes easy to perform optimization of the overall error rate.

Out of input data of 120 Gbps, data of 80 Gbps is combined with the low-power second error correction circuit 8b, and drastic power consumption reduction can be achieved in comparison with the case where all the data is assigned to the high-power first error correction circuit 8a. Further, the rate of the transmission line II (16QAM@timeslot 2) with a relatively low transmission characteristic being combined with the first error correction circuit 8a with a high error correction capability increases. Accordingly, it is possible to improve overall transmission characteristics while suppressing power consumption.

Sixth Embodiment

FIG. 15 is a diagram showing a communication device according to a sixth embodiment of the present invention. In the present embodiment, the method for configuring the plurality of transmission lines is changed from the method of switching the modulation scheme for each subcarrier of OFDM of the fourth embodiment to a method of switching a modulation scheme for each polarized wave. That is, the X polarized wave is transmitted by QPSK modulation, and the Y polarized wave is transmitted by 16QAM modulation. In general, QPSK modulation has a higher transmission characteristic than 16QAM modulation. Therefore, transmission by QPSK modulation corresponds to the transmission line I of the first embodiment, and transmission by 16QAM corresponds to the transmission line II. Though description has been made using only the X polarized wave in the third and fourth embodiments, a method of configuring the plurality of transmission lines using both of the X polarized wave and the Y polarized wave will be described in the present embodiment.

A method for combining the first error correction circuit 8a with a high error correction capability and power consumption and the second error correction circuit 8b with a relatively low error correction capability and power consumption with the transmission line I and the transmission line II can be decided similarly to the first embodiment. An example of a method for the combination is shown below. An optimal combination method in the system is decided from the overall error rate and power as described above. Note that, in the case of configuring the plurality of transmission lines with polarized waves, by changing transmission power and SNR for each modulation scheme, that is, for each transmission line, it becomes easy to perform optimization of the overall error rate.

TABLE 6

| Rate [Gbps] | First error correction circuit | Second error correction circuit | Subtotal |
|---|---|---|---|
| Transmission line I (QPSK@X polarized wave) | $R_{I\_A}$: 0 | $R_{I\_B}$: 60 | 60 |
| Transmission line II (16 QAM@Y polarized wave) | $R_{II\_A}$: 40 | $R_{II\_B}$: 20 | 60 |
| Total | R1: 40 | R2: 80 | R0: 120 |

Out of input data of 120 Gbps, data of 80 Gbps is combined with the low-power second error correction circuit 8b, and drastic power consumption reduction can be achieved in comparison with the case where all the data is assigned to the high-power first error correction circuit 8a. Further, the rate of the transmission line II (16QAM@Y polarized wave) with a relatively low transmission characteristic being combined with the first error correction circuit 8a with a high error correction capability increases. Accordingly, it is possible to improve overall transmission characteristics while suppressing power consumption.

Note that, though QPSK and 16QAM are illustrated as the plurality of modulation schemes in the third to fifth embodiments, the modulation schemes are not limited thereto, but all modulation schemes are applicable. As other modulation schemes, BPSK, 8QAM, 64QAM, 256QAM, and the like are also applicable.

Further, the first to fifth embodiments may be mutually combined. For example, the method of using multi-leveled bits in the first and second embodiments and the method of performing transmission in time division of the third embodiment can be combined. By such a combination, it is possible to further optimize an error rate.

A program for implementing the error correction methods according to the first to fifth embodiments may be recorded in a computer-readable recording medium so that the program recorded in the recording medium is read in and executed by a computer system or a programmable logic device to perform phase compensation. The "computer system" described here may contain hardware such as OS, peripheral equipment, etc. The "computer system" may contain a WWW system having a homepage providing environment (or displaying environment). The "computer-readable recording medium" may be a portable medium such as a flexible disc, a magneto-optic disc, ROM and CD-ROM, or a storage device such as a hard disc incorporated in a computer system. Furthermore, the "computer-readable recording medium" may contain an element for holding a program for a constant time like a volatile memory (RAM) in a computer system serving as a server or a client when a program is transmitted through a network such as the Internet or a communication line such as a telephone line. The program may be transmitted from a computer system having a storage device or the like in which the program is stored, to another computer system via a transmission medium or by transmission waves in a transmission medium. Here, the "transmission medium" for transmitting the program is a medium having a function of transmitting information like a network (communication network) such as the Internet or a communication circuit (communication line) such as a telephone line or the like. The program may be provided to perform a part of the foregoing function. Furthermore, the program may be provided to perform the foregoing function in combination with a program which has been already stored in the computer system, so-called a differential file (differentia program).

REFERENCE SIGNS LIST

I first transmission line; II second transmission line; 8a first error correction circuit; 8b second error correction circuit; 10a first coding portion; 10b second coding portion; 11 transmission side combining portion; 12 reception side combining portion

What is claimed is:

1. An error correction device used in a communication device transmitting data of a predetermined transmission rate through a plurality of transmission lines configured in one carrier or one channel band, comprising:
a plurality of error correction circuits correcting errors of the data transmitted through the plurality of transmission lines; and
a combining portion combining the plurality of transmission lines to the plurality of error correction circuits,
wherein the plurality of transmission lines include a first transmission line, and a second transmission line having a lower transmission characteristic than the first transmission line, the plurality of error correction circuits includes a first error correction circuit, and a second error correction circuit having lower error correction capability and power consumption than the first error correction circuit, and
the combining portion uses a function of combining a plurality of error correction circuits in one transmission line to allocate data of the transmission line, combines the first transmission line with the second error correction circuit at a higher rate than the first error correction circuit, and combines the second transmission line with the first error correction circuit at a higher rate than the second error correction circuit;
wherein the combining portion decides a combination state between the plurality of transmission lines and the plurality of error correction circuits in consideration of an overall error rate of the data and total power of the plurality of error correction circuits.

2. The error correction device according to claim 1, wherein as the data, a plurality of internal data contained in one code term for error correction are distributed to the plurality of transmission lines.

3. The error correction device according to claim 1, wherein the plurality of transmission lines are divided by multi-level modulation transmission bits.

4. The error correction device according to claim 1, wherein the plurality of transmission lines are divided by a plurality of modulation schemes of OFDM subcarrier.

5. The error correction device according to claim 1, wherein the plurality of transmission lines are divided by a plurality of modulation schemes switched in time division.

6. The error correction device according to claim 1, wherein the plurality of transmission lines are divided by a plurality of modulation schemes corresponding to polarized wave.

7. An error correction method used in a communication device transmitting data of a predetermined transmission rate through a plurality of transmission lines configured in one carrier or one channel band, comprising:
 correcting errors of the data transmitted through the plurality of transmission lines by a plurality of error correction circuits; and
 combining the plurality of transmission lines to the plurality of error correction circuits by a combining portion,
 wherein the plurality of transmission lines includes a first transmission line, and a second transmission line having a lower transmission characteristic than the first transmission line,
 the plurality of error correction circuits includes a first error correction circuit, and a second error correction circuit having lower error correction capability and power consumption than the first error correction circuit, and
 by using a function of the combining portion of combining a plurality of error correction circuits in one transmission line to allocate data of the transmission line, the combining portion, the first transmission line is combined with the second error correction circuit at a higher rate than the first error correction circuit and the second transmission line is combined with the first error correction circuit at a higher rate than the second error correction circuit;
 wherein the combining portion decides a combination state between the plurality of transmission lines and the plurality of error correction circuits in consideration of an overall error rate of the data and total power of the plurality of error correction circuits.

8. A communication device comprising an error correction device used in a communication device transmitting data of a predetermined transmission rate through a plurality of transmission lines configured in one carrier or one channel band, comprising:
 a plurality of error correction circuits correcting errors of the data transmitted through the plurality of transmission lines; and
 a combining portion combining the plurality of transmission lines to the plurality of error correction circuits,
 wherein the plurality of transmission lines include a first transmission line, and a second transmission line having a lower transmission characteristic than the first transmission line,
 the plurality of error correction circuits includes a first error correction circuit, and a second error correction circuit having lower error correction capability and power consumption than the first error correction circuit, and
 the combining portion uses a function of combining a plurality of error correction circuits in one transmission line to allocate data of the transmission line, combines the first transmission line with the second error correction circuit at a higher rate than the first error correction circuit, and combines the second transmission line with the first error correction circuit at a higher rate than the second error correction circuit;
 wherein the combining portion decides a combination state between the plurality of transmission lines and the plurality of error correction circuits in consideration of an overall error rate of the data and total power of the plurality of error correction circuits.

* * * * *